United States Patent [19]

Kondo et al.

[11] Patent Number: 5,236,810
[45] Date of Patent: Aug. 17, 1993

[54] PROCESS FOR PREPARING PRINTED-CIRCUIT BOARD

[75] Inventors: Toshio Kondo; Shinsuke Onishi; Naozumi Iwasawa; Sadaaki Hashimoto, all of Hiratsuka, Japan

[73] Assignee: Kansai Paint Co., Ltd., Amagasaki, Japan

[21] Appl. No.: 592,245

[22] Filed: Oct. 3, 1990

[30] Foreign Application Priority Data

| Oct. 3, 1989 | [JP] | Japan | 1-258525 |
| Oct. 3, 1989 | [JP] | Japan | 1-258526 |
| Oct. 19, 1989 | [JP] | Japan | 1-271956 |

[51] Int. Cl.⁵ ............................ G03F 7/26; H05K 3/00
[52] U.S. Cl. ..................................... 430/313; 430/311; 430/318; 430/319; 430/325; 430/327; 430/328; 430/329; 430/396
[58] Field of Search ............... 430/311, 313, 318, 319, 430/325, 327, 328, 329, 394, 396

[56] References Cited

U.S. PATENT DOCUMENTS

| 3,492,213 | 1/1970 | Johnson | 204/181 |
| 3,497,356 | 2/1970 | Martinson | 96/86 |
| 3,554,886 | 1/1971 | Colomb, Jr. et al. | 204/159.12 |
| 3,558,741 | 1/1971 | Hotch et al. | 260/827 |
| 3,864,230 | 2/1975 | Springer et al. | 204/181 |
| 3,954,587 | 5/1976 | Kokawa | 204/181 |
| 4,024,039 | 5/1977 | Yoshida et al. | 204/181 |
| 4,040,925 | 8/1977 | McGinniss | 204/181 |
| 4,592,816 | 6/1986 | Emmons et al. | 204/180.6 |
| 4,632,900 | 12/1986 | Demmer | 430/327 |
| 4,673,458 | 1/1987 | Ishikawa et al. | 156/659.1 |
| 4,702,995 | 10/1987 | Okada | 430/327 |
| 4,845,012 | 7/1989 | Seko et al. | 430/287 |
| 4,931,380 | 6/1990 | Owens | 430/327 |
| 4,985,344 | 1/1991 | Uchino et al. | 430/325 |

FOREIGN PATENT DOCUMENTS

| 207139 | 10/1985 | Japan . |
| 206293 | 9/1986 | Japan . |
| 6070 | 1/1988 | Japan . |
| 60594 | 3/1988 | Japan . |
| 4671 | 1/1989 | Japan . |
| 64-4671 | 1/1989 | Japan . |
| 4672 | 1/1989 | Japan . |
| 64-4672 | 1/1989 | Japan . |
| 90270 | 4/1989 | Japan . |
| 121375 | 5/1989 | Japan . |
| 20873 | 1/1990 | Japan . |

*Primary Examiner*—Marion E. McCamish
*Assistant Examiner*—Kathleen Duda
*Attorney, Agent, or Firm*—Fisher, Christen & Sabol

[57] ABSTRACT

An improved process for preparing a printed-circuit board, which successively comprises (I) a step of forming a positive photo-sensitive resist film onto a circuit board having a conductive film according to the electrodeposition coating process, (II) a step of irradiating a full dose of an actinic ray onto the positive photo-sensitive resist film through a photomask with which the actinic ray is cut off over a conductive circuit-forming area, (III) a step of developing the resulting resist film, (IV) a step of etching away a deposited copper-clad area, and (V) removing a remaining resist film on the conductive circuit-forming area, the improvement further comprising a step of imparting the resist film in the conductive circuit-forming area an increased alkali resistance prior to development so as to obtain the printed-circuit board having high resolution with good reproductivity without being affected by variations of the developing conditions.

6 Claims, No Drawings

PROCESS FOR PREPARING PRINTED-CIRCUIT BOARD

BACKGROUND OF THE INVENTION

(1) Field of the Invention

This invention relates to a process for preparing a printed-circuit board, and more particularly to a process for preparing a printed-circuit board having excellent developing properties by use of a positive photo-sensitive electrodeposition coating composition.

(2) Description of the Prior Art

In recent years, printed-circuit boards have widely been produced by use of a photo-sensitive electrodeposition coating composition. Recently, it has been demanded to provide a process for preparing a printed-circuit board having a fine pattern and having through-holes with a hole diameter of 0.4 mm or less at high efficiency and reliability. In order to provide the above process, many processes for preparing a printed-circuit board, for example, by use of a positive photo-sensitive electrodeposition coating composition have been proposed (see, for example, Japanese Patent Application Laid-Open Nos. 207139/85, 206293/86, 6070/88, etc.).

The industrial advantages of preparing the printed-circuit board by use of the positive photo-sensitive electrodeposition coating composition (hereinafter may be referred to as the positive electrodeposition coating composition) are in that use of the electrodeposition coating composition makes it possible to form a resist film in the interior of through-holes and also makes it possible to easily prepare a printed-circuit board having such small conductive holes, i.e. through-holes as to be difficult for being exposed to light, because there is no need of curing a resist film with an actinic ray and making it insoluble in a developing solution as in the case of the negative resist film.

In spite of the above advantages, the positive electrodeposition coating composition has, on the other hand, such disadvantages that developing properties at the time of developing the resist film are easily affected by the developing conditions such as humidity, temperature, time and the like due to small differences in solubility to an alkaline developing solution between an exposed area and an unexposed area, resulting in making it impossible to obtain a printed-circuit board having high resolution with good reproductivity.

SUMMARY OF THE INVENTION

It is an object of the present invention to provide a process for preparing a printed-circuit board, which makes it possible to increase differences in solubility to the alkaline developing solution between the conductive circuit-forming area and the area not forming the conductive circuit, resulting in making it possible to obtain the printed-circuit board having high resolution with good reproductivity without being affected by variations of the developing conditions.

That is, the present invention provides an improved process for preparing a printed-circuit board, which successively comprises (I a step of forming a positive photo-sensitive resist film onto a circuit board having a conductive film according to the electrodeposition coating process, (II) a step of irradiating a full dose of an actinic ray onto the positive photo-sensitive resist film through a photomask with which the actinic ray is cut off over a conductive circuit-forming area, (III) a step of developing the resulting resist film, (IV) a step of etching away a deposited copper-clad area, and (V) removing a remaining resist film on the conductive circuit-forming area, in its first aspect, the improvement further comprising a step of uniformly irradiating a moderately small dose of the actinic ray onto the positive photo-sensitive resist film to impart an increased alkali resistance the resist film in the conductive circuit-forming area prior to the step of irradiating the actinic ray through the photomask, in its second aspect, the improvement further comprising a step of uniformity irradiating a moderately small dose of the actinic ray onto the positive photosensitive resist film to impart an increased alkali resistance the resist film in the conductive circuit-forming area after the step of irradiating the actinic ray through the photomask, in its third aspect, the improvement further comprising a step of dipping the resist film into a weak alkaline solution followed by drying to impart an increased alkali resistance the resist film in the conductive circuit-forming area after the step of irradiating the actinic ray through the photomask, in its fourth aspect, the improvement further comprising a step of dipping the resist film into a weak alkaline solution followed by drying to impart an increased alkali resistance the resist film in the conductive circuit-forming area prior to the step of irradiating the actinic ray through the photomask, and, in its fifth aspect, the improvement further comprising a step of irradiating a full dose of the actinic ray onto the resist film through such a photomask that the actinic ray transmits in a moderately small dose in the conductive circuit-forming area to impart an increased alkali resistance the resist film therein, but fully transmits in the area not forming the conductive circuit instead of the step (II).

The positive electrodeposition coating composition used in the present invention is not specifically limited so long as a positive resist film is formed on the conductive board according to the electrodeposition coating process, and a resin carrying a photo-sensitive group and an ion-forming group and selected from, for example, acrylic resin, polyester resin, epoxy resin, phenol resin and the like may be used without limitation as the resin mainly constituting the positive electrodeposition coating composition. Of these, the particularly preferable positive electrodeposition coating composition is one mainly containing an acrylic resin having in the molecule an ion-forming group to be ionized by neutralization and a photo-sensitive group represented by the following formula (I):

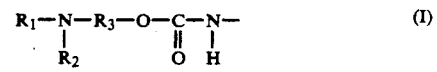

where $R_1$ represents

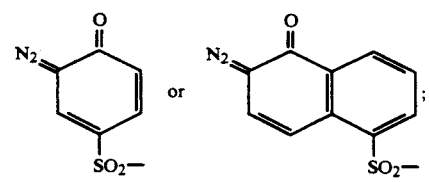

$R_2$ represents hydrogen atom, alkyl group, cycloalkyl group or alkoxyalkyl group; and $R_3$ represents alkylene group, cycloalkylene group or alkoxyalkylene group.

The above electrodeposition coating composition may be classified into an anionic one and a cationic one, and both of them may be used.

It is not always necessary for the resin used in the above electrodeposition coating to contain both the photo-sensitive group and the ion-forming group in an identical resin molecule. A mixture of a compound or resin containing a photo-sensitive group with a resin containing an ion-forming group and free of the photo-sensitive group may also be used in the above electrodeposition coating composition. Examples of the compound or resin capable of carrying the photo-sensitive group may include, in addition to the above resins, polyhydroxy benzophenone, polyhydroxy benzene, polyisocyanate, polyhydric alcohol, pyrogallol/formaldehyde condensate, and the like.

Introduction of the photo-sensitive group may be carried out by known processes per se, for example, by a process which comprises reacting orthobenzoquinonediazidosulfonic acid, orthonaphthoquinonediazidesulfonic acid, and halides thereof (hereinafter may be referred to simply a "quinonediazido compound") with an alkanol amine such as ethanol amine, neopentanol amine, N-methylethanol amine, and the like to be sulfonamidized or sulfonimidized, and reacting the hydroxyl group-containing quinonediazido compound thus obtained with, for example, an isocyanate group-containing compound or resin. From the resulting reaction product, the resin mainly constituting the above electrodeposition coating composition may be prepared according to the processes disclosed in, for example, Japanese Patent Application Laid-Open Nos. 90270/89, 121375/89, etc.

Preferable examples of the above quinonediazido compound may include 1,2-benzoquinonediazido-4-sulfonic acid chloride and 1,2-naphthoquinonediazido-5-sulfonic acid chloride.

The above resin having the photo-sensitive group and the ion-forming group is neutralized with amine or an alkali compound when anionic, or with an organic acid or an inorganic acid when cationic respectively, followed by being dispersed or dissolved in water to be used in the electrodeposition coating composition. The use of the above positive electrodeposition coating composition results in forming a resist film having high pattern resolution and in providing an electrodeposition coating bath having such a high stability as to be excellent in long term running stability.

Other known positive photo-sensitive resin compositions, for example, ones prepared by a process which comprises introducing acid group or amino group into polyoxymethylene polymer, o-nitrocarbinol ester, o-nitrophenyl acetal, quinonediazido sulfonyl ester, etc., followed by neutralizing to form an aqueous solution of the resulting salt, may be applicable to the electrodeposition coating process. The resist film formed on the board by use of the above resin composition may be expected to be improved in developing properties according to the process of the present invention The electrodeposition coating bath used in the present invention is classified into an anionic one and a cationic one depending on the kind of the ion-forming group in the resin used.

Respective steps of the process of the present invention are explained in the case where the anionic electrodeposition coating composition is used as an example. The base plate to be subjected to the electrodeposition coating may be the conventional copper-clad base plate for use in the printed-circuit board having conductive holes and non-conductive holes with no limitations to thickness, shape, etc.

The electrodeposition coating onto the circuit board may carried out in the same manner as in the formation of the conventional positive photo-sensitive resist film. That is, it is carried out by dipping the circuit board as an anode into the electrodeposition coating bath, followed by applying a direct current under 20–400 V between both electrodes. The application time of the direct current is normally in the range of 30 to 300 seconds. A film thickness of the resist film formed on the circuit board is in the range of 2 to 100 um, preferably 2 to 20 um.

After the completion of the application of the direct current, the circuit board is taken out from the electrodeposition coating bath and washed with water, followed by removing moisture, etc. contained in the resist film with hot air, air knife, etc.

The step (II) and improved steps in the process of the present invention are explained below.

According to the first aspect of the present invention, a moderately small dose of the actinic ray is uniformly irradiated onto the circuit board on which a resist film is formed by the electrodeposition coating process. When the circuit board has through-holes, the above irradiation is effected onto the interior of the through-hole. Thereafter, a full dose of the actinic ray is irradiated onto the resist film through a photomask with which the actinic ray is effectively cut off over the conductive-circuit-forming area.

According to the second aspect of the present invention, the irradiation of the full dose of the actinic ray in the first aspect is followed by the uniform irradiation of a moderately small dose of the actinic ray in the first aspect of the present invention.

According to the first and second aspects of the present invention, the resist film on the conductive circuit-forming area is moderately exposed to light, resulting in that alkali resistance of the resist film thereon is increased and that differences in solubility to the developing solution between the fully exposed area and the moderately exposed area are increased to be appreciably distinguished from each other. The reason why the alkali resistance of the moderately exposed resist film subjected to irradiation of a moderately small dose of the actinic ray is increased, has not been clarified Yet, but it is guessed that any reaction between photo-sensitive groups might have taken place. It is guessed as follows by exemplifying a resin having quinonediazido sulfonic acids as the photo-sensitive group moiety. Irradiation of the actinic ray in a dose exceeding a predetermined dose onto the above resin results in that the quinonediazido moiety as the photo-sensitive group moiety is converted via ketene into carboxylic acid to be easily developed with a weak alkaline solution. Contrary thereto, it is considered that irradiation of a moderately small dose of the actinic ray results in that an azo group ($N=$) moiety of the photo-sensitive group moiety remains to be activated so that azo coupling may take place, or dimerization, etc. may take place to increase the molecular weight of the resin and to form such a resin as to be insoluble in the developing solution as a weak alkaline solution.

Further irradiation of the actinic ray onto the resin thus obtained in a dose exceeding a predetermined results in decomposition of a bonded part in the photo-sensitive group moiety to become developable. After the completion of the above photodecomposition, the molecular weight of the resulting resin is no longer increased by dimerization, etc. A course of changes of the above resin due to variation of an irradiation dose of the actinic ray was demonstrated by the thin-layer chromatography.

In the first and second aspects of the present invention, such a moderately small dose of the actinic ray as to make the resist film moderately exposed means a dose equal to 5-40%, preferably 10-30% of a normal dose necessary for a full exposure, which varies depending on the resist film used, but which is normally in the range of 100 to 400 mj/cm$^2$. In the case where the resins having quinonediazido sulfonic acids as examples are used, the normal dose necessary for the full exposure is in the range of 180 to 400 mj/cm$^2$, preferably 200 to 350 mj/cm$^2$, whereas the moderately small dose of the actinic ray is in the range of 2 to 150 mj/cm$^2$, preferably 10 to 100 mj/cm$^2$. When the above dose of the actinic ray is less than 2 mj/cm$^2$, alkali resistance of the resist film therein is not so increased as to achieve the effect of the improved steps, in the first and second aspects of the present invention. When the above dose is more than 150 mj/cm$^2$, photodecomposition may proceed to such an extent that the resist film may wholly be dissolved during development.

In the first and second aspects of the present invention, in the case where a circuit board having through-holes is used, an actinic ray irradiated in a moderately small dose is preferably in the form of a scattered light, resulting in that the interior of the through-hole is easily and moderately exposed and that alkali resistance in the interior of the through-hole is improved.

In the first and second aspect of the present invention, in the case where the through-hole is a landed one, a photomask capable of cutting off the actinic ray over a circular area corresponding to a land diameter is used, while in the case where the through-hole is a landless one, a photomask capable of cutting off the actinic ray over the through-hole area.

In the first and second aspect of the present invention, the actinic ray used in the exposure of the positive resist film to light may preferably be ones having a wave length of 250 to 450 nm Examples of these light sources may include sun light, mercury lamp, xenon lamp, arc lamp and the like. Irradiation of the actinic ray is carried out normally in the range of 1 to 20 seconds.

In the first and second aspects of the present invention, in the case of a circuit board consisting of landed through-holes and non-conductive holes, both parallel light and scattered light may be used as the light source irradiated in a full dose, whereas in the case of a circuit board consisting of landless through-holes, it is necessary to use a parallel light or ones similar thereto as the light source.

In the third aspect of the present invention, a full dose of the actinic ray is irradiated onto the circuit board through a photomask with which the actinic ray is effectively cut off over the conductive circuit-forming area, in the same manner as in the first and second aspects of the present invention. After the completion of the full exposure, the circuit board is dipped into an aqueous weak alkaline solution to be dried. The above improved step of the third aspect of the present invention is a pretreatment step prior to development so as to clearly distinguish difference in solubility to the developing solution between the exposed area and the unexposed area, resulting in increasing alkali resistance of the resist film. The reason why the alkali resistance of the above resist film is increased by dipping the resist film into an aqueous weak alkaline solution followed by drying, has not been clarified Yet, but it is guessed that any reaction might have taken place between the photosensitive group moieties. It may be guessed as follows by exemplifying a resin having quinonediazido sulfonic acids at a position of the photo-sensitive group moiety.

It is considered that the presence of the weak alkali causes the above resin to take place an azo coupling or to form an ester linkage between the photo-sensitive group moieties and that these reactions are promoted by the following drying process to increase the molecular weight of the resin or the surface of the resist film, resulting increasing the alkali resistance of the resist film.

The increase in alkali resistance takes place in the unexposed area, but does not take place in the photodecomposed area. On the other hand, the alkali resistance-increased resist film may be photo-decomposed by irradiating a full dose of the actinic ray thereonto as in the above irradiation step to become developable. Therefore, the above improved step of dipping the resist film into the aqueous weak alkaline solution may be carried out prior to the above step of irradiating a full dose of the actinic ray with the same effect as that of the present invention, as referred to as the fourth aspect of the present invention.

The aqueous weak alkaline solution used in the third and fourth aspect of the present invention may preferably include 0.1-3% aqueous solutions of sodium carbonate, sodium metasilicate, amine, etc. The temperature of the dipping solution is preferably in the range of 20° to 35° C, and the dipping time is normally in the range of 2-60 seconds, preferably 10-30 seconds. When the dipping solution temperature and the dipping time are outside the above ranges, the effect of the above improved dipping step may not be obtained, or the resist film may be dissolved as it is. Drying after dipping is preferably carried out by blowing a hot air at a temperature of 70°-90° C. for 3-5 minutes. When the above ranges are exceeded, it may become difficult for the exposed area to be dissolved at the time of development.

According to the fifth aspect of the present invention, a full dose of the actinic ray is irradiated onto all over the resist film through such a photomask that the actinic ray transmits in a moderately small dose only in the conductive circuit-forming area, but fully transmits in the area not forming the conductive circuit in place of the photomask used in the step (II) with the results that the resist film on the conductive circuit-forming area is moderately exposed and alkali resistance of the resist film thereon is increased, and that differences in solubility to the developing solution between the fully exposed area and the moderately exposed area are increased to be appreciably distinguished from each other. The reason why the alkali resistance of the resist film in the conductive circuit-forming area is increased by being moderately exposed, has not been clarified yet, but it may be guessed as in the first and second aspects of the present invention.

The photomask used in the fifth aspect of the present invention is such that the actinic ray may transmit in a dose equal to 5-40%, preferably 10-30% of a normal dose necessary for a full exposure, which varies depending on the resist film used, but which is normally in the range of 100 to 400 mj/cm$^2$. In the case where the resins having quinonediazido sulfonic acids as examples are used, the normal dose necessary for the full exposure is in the range of 180–400 mj/cm$^2$. preferably, 200 to 350 mj/cm$^2$, whereas the moderately small dose of the actinic ray is in the range of 2 to 150 mj/cm$^2$, preferably 10 to 100 mj/cm$^2$. When the above dose of the actinic ray is less than 2 mj/cm$^2$, alkali resistance of the resist film therein is not so increased as to achieve the effect of the improved step of the fifth aspect of the present invention. When the above dose is more than 150 mj/cm$^2$, photodecomposition may proceed to such an extent that the resist film may wholly be dissolved during development.

On the other hand, the photomask used in the fifth aspect of the present invention is such that the actinic ray may fully transmit in the area not forming the conductive circuit.

So long as the above conditions are satisfied, any photomask made of the material used in the conventional photomask may be used without special limitations to material and thickness. For example, photomasks, the conductive circuit-forming of which is formed of heat resistant organic films of polyethylene terephthalate, polyimide. etc. treated with a silver salt, of glass materials, and so forth, may also be used. The transmitting dose of the actinic ray through the conductive circuit-forming area may be controlled within the above range by a coated thickness of the silver salt, etc. prepared according to the photographic process at the time of forming a photomask pattern taking the film thickness, the irradiation dose of the actinic ray, etc. into consideration.

In the fifth aspect of the present invention, the actinic ray used in the exposure of the positive resist film to light may preferably be ones having a wave length of 250 to 450 nm. Examples of these light sources may include sun light, mercury lamp, arc lamp and the like. Irradiation of the actinic ray is carried out normally in the range of 1 to 20 seconds.

The steps (III), (IV) and (V) in the present invention are substantially identical to respective aspects of the present invention as explained below.

After the completion of the above steps, the resulting circuit board is subjected to the developing treatment by softly spraying a 0.1–3% weak alkaline developing solution of sodium carbonate, sodium metasilicate, amine, etc. under a pressure of 0.5–2 kg/cm$^2$. Thereafter, the copper foil deposited on the base board is removed by treating with an etching solution such as an aqueous cupric chloride solution. Next, the resist film on the circuit pattern is removed by treating with a strong alkaline stripping solution such as a 3–10% aqueous caustic soda solution, or with a solvent which is capable of dissolving the resist film on the circuit pattern, resulting in forming a printed-circuit board in the case where the anionic positive electrodeposition coating composition is used.

In the case where the cationic positive electrodeposition coating composition is used, the printed-circuit board of the present invention may be obtained in the same manner as in the case of the anionic positive electrodeposition coating composition except that the circuit board is used as a cathode, that the alkaline etching solution such as an aqueous mixed solution of ammonium hydroxide and ammonium chloride as the etching solution, and that an acid or solvent is used for removal of the resist film on the circuit pattern.

According to the first and second aspect of the present invention, the improved step of uniformly irradiating a moderately small dose of the actinic ray all over the resist film is carried out in addition to the normal irradiation step prior to development, and the resist film on the conductive circuit-forming area is moderately exposed to light so that the alkali resistance of the photo-decomposable resin is increased due to the reaction between photo-sensitive group moieties, resulting in that when developed, differences in solubility to the alkaline developing solution between the conductive circuit-forming area and the area not forming the conductive circuit are increased to obtain the printed-circuit board having high resolution with good reproductivity without being affected by variations of the developing conditions.

According to the third and fourth aspects of the present invention, the improved step of dipping the resist film into the weak alkaline solution followed by drying is arrived out in addition to the normal irradiation step prior to development so that alkali resistance of the photo-decomposable resin is increased due to the reaction between photo-sensitive group moieties, resulting in that when developed, differences in solubility to the alkaline developing solution between the conductive circuit-forming area and the area not forming the conductive circuit are increased to obtain the printed-circuit board having high resolution with good reproductivity without being affected by variations of the developing conditions.

According to the fifth aspect of the present invention, the improved step of irradiating a full dose of the actinic ray onto the resist film through such a photomask that the actinic ray transmits in a moderately small dose in the conductive circuit-forming area to impart an increased alkali resistance the resist film thereon, but fully transmits in the area not forming the conductive circuit is carried out instead of irradiating through the conventional photomask prior to development so that alkali resistance of the photo-decomposable resin is increased due to the reaction between photo-sensitive group moieties, resulting in that when developed, differences in solubility to the alkaline developing solution between the conductive circuit-forming area and the area not forming the conductive circuit are increased to obtain the printed-circuit board having high resolution with good reproductivity without being affected by variations of the developing conditions.

The present invention is explained more in detail by the following Examples, in which "part" and "%" represent "part by weight" and "% by weight" respectively.

PREPARATION EXAMPLE 1 OF POSITIVE PHOTO-SENSITIVE ELECTRODEPOSITION COATING COMPOSITION

A four-necked flask was charged with 269 parts of 1,2-naphthoquinonediazido-5-sulfonic acid chloride and 1345 parts of dioxane, followed by dropping 150 parts of N-methylethanol amine over one hour with agitation at room temperature. After the completion of the dropping procedure, agitation was further continued for about 3 hours, and the reaction was stopped after confirming that an adsorption of amino group around 3300 cm$^{-1}$ of the infrared spectrum had disappeared.

Next, the resulting solution was introduced into deionized water to remove the quaternary ammonium salt in which hydrochloric acid produced during reaction was trapped. Thereafter, the reaction product was extracted with isobutyl acetate, followed by distilling off the solvent, drying in a vacuum dryner to obtain a hydroxyl group-containing orthoquinonediazido compound (a).

Next, a solution prepared by dissolving 309 parts of the above compound (a) in 1500 parts of dioxane was dropped over one hour into a mixture of 0.5 part of dibutyltin dilaurate and 174 parts of tolylene diisocyanate at 60° C., following by keeping at that temperature for 4 hours to obtain a compound (b) solution. To 2157 parts of the compound (b) solution was added a solution of 77 parts of 2,3,4-trihydroxybenzophenone in 300 parts of dioxane, followed by further reacting at 60° C. until an adsorption of isocyanate group around 2250 $cm^{-1}$ of infrared spectrum had disappeared, introducing the reaction mixture into a large amount of deionized water, filtering off the deposited solid contents, thoroughly washing with water, and drying under vacuum to obtain a photo-sensitive material (A).

Another four-necked flask is charged with 1000 parts of methylisobutyl ketone, following by heating at 100° C., dropping a mixture of 500 parts of n-butyl acrylate, 90 parts of acrylic acid, 300 parts of methyl methacrylate, 110 parts of styrene and 3 parts of azobisisobutyronitrile over 3 hours, keeping at that temperature for 3 hours, and distilling off methylisobutyl ketone under vacuum until a solid content of the solution had reached 75%. To the resulting resin solution was added a solution of 300 parts of the photo-sensitive material (A) in 900 parts of dimethyl glyme to be thoroughly mixed, adding 63 parts of triethylamine and 100 parts of butyl cellosolve for neutralizing, and slowly adding 10150 parts of deionized water to the resulting mixture under agitation at a speed of 1000 to 1500 rpm to obtain a stable aqueous dispersion.

PREPARATION EXAMPLE 2 OF POSITIVE PHOTO-SENSITIVE ELECTRODEPOSITION COATING COMPOSITION

A four-necked flask is charged with 1030 parts of dimethyl diglyme, followed by heating at 100° C., dropping a mixture of 500 parts of n-butyl acrylate, 90 parts of acrylic acid, 130 parts of 2-hydroxyethyl acrylate, 280 parts of methyl methacrylate and 3 parts of azobisisobutyronitrile over 3 hours, keeping at the at temperature for 3 hours, cooling down to 60° C., adding 1340 parts of the compound (b) solution obtained in Preparation Example 1 and 1.0 part of dibutyltin dilaurate, reacting at 60° C. until an absorption around 2250 $cm^{-1}$ of isocyanate group had disappeared, and concentrating under vacuum until the solid content had reached 60%. To the resulting resin solution was added 63 parts of triethyamine and 100 parts of butyl cellosolve for neutralizing, and slowly adding 10650 parts of deionized water to the resulting mixture under agitation at a speed of 1000 to 1500 rpm to obtain a stable aqueous dispersion.

EXAMPLE 1

A copper-clad base plate having a plate thickness of 1.6 mm, a hole diameter of 0.8 mm, and a copper-clad thickness of 35 μm was dipped into a coating composition bath obtained from the aqueous dispersion of Preparation Example 1 at 25° C., followed by applying 100 V for 90 seconds, washing with water, and drying to obtain a resist film having a thickness of 10 μm. An actinic ray was irradiated in a dose of 50 mj/cm² all over the base plate covered with the resist film by use of a scanning type exposure device (ultra-high pressure mercury lamp, 80 W/cm). Thereafter, the actinic ray was irradiated in a dose of 300 mj/cm² onto the resist film through a photomask cutting off the actinic ray in the conductive circuit-forming area.

A 2% aqueous sodium metasilicate solution at 30° C. was softly sprayed onto the resulting exposed base plate for 2 minutes under a pressure of 0.5–2 kg/cm², followed by washing with water to carry out development. Thereafter, etching was carried out with an aqueous cupric chloride solution, followed by stripping the resist film remaining in the conductive circuit-forming area with methylene chloride to obtain a circuit board. In spite of a variation of ±5° C. in the developing solution temperature to a predetermined temperature in the developing step, the copper cladding in the hole was completely protected with a pattern width of line/space = 100/100 − 200/200 (μm/μm) for all of 300 circuit boards prepared according to the above steps, and all of the circuit boards showed high resolution.

EXAMPLE 2

The procedures of Example 1 were repeated except that a coating composition bath obtained from the aqueous dispersion of Preparation Example 2 was used, and a 3% aqueous sodium metasilicate solution at 35° C. was used as the developing solution to obtain 300 circuit boards, resulting in that both pattern and copper cladding in the hole were in excellent conditions.

EXAMPLE 3

An actinic ray from the scanning type exposure device (ultra-high pressure mercury lamp), 80 W/cm) was irradiated in a dose of 250 mj/cm² through the photomask cutting off the actinic ray in the conductive circuit-forming area onto the base plate covered with the resist film prepared in the same manner as in Example 1. Thereafter, the actinic ray from the above exposure device was irradiated in a dose of 60 mj/cm² all over the resist film. A 1% aqueous sodium metasilicate solution at 30° C. was softly sprayed for 2 minutes under a pressure of 0.5 to 2 kg/cm² onto the resulting exposed base plate, followed by washing with water to carry out development, etching away the deposited copper-clad area with an aqueous cupric chloride solution, and stripping the resist film remaining on the conductive circuit-forming area with a 3% aqueous caustic soda solution.

In spite of a variation of ±5° C. in the developing solution temperature to a predetermined temperature in the developing step, the fine patterns of line/space = 150/150 (μm/μm) showed no defects and showed high resolution for all of 300 circuit boards prepared according to the above steps.

COMPARATIVE EXAMPLE 1

The procedures of Example 1 were repeated except for excluding the step of irradiating the actinic ray all over the base plate covered with the resist film to obtain 300 circuit boards. Because of a variation of ±5° C. in the developing solution temperature to a predetermined temperature in the developing step, many of the above circuit boards had such defects that the patterns of line/space partly showed cuts and pattern zigzags, and that touching took place due to a residual resist film.

EXAMPLE 4

An actinic ray from the same exposure device as in Example 1 was irradiated in a dose of 300 mj/cm², through a photomask cutting off the actinic ray in the conductive circuit-forming area onto a base plate covered with the resist film prepared in the same manner as in Example 1. The resulting exposed base plate was dipped into a 1% aqueous sodium metasilicate solution at 25° C. for 20 seconds, followed by washing with water, drying, softly spraying a 1% aqueous sodium metasilicate solution for 2 minutes under a pressure of 0.2-5 kg/cm$^2$, washing with water to carry out development. Thereafter, an etching treatment was carried out with an aqueous cupric chloride solution, followed by stripping the residual unexposed resist film with a 5% aqueous caustic soda solution to obtain a circuit board. In spite of a variation of ±5° C. in the developing solution temperature to a pre- determined temperature in the developing step, the copper cladding in the hole of the circuit board was completely protected with a pattern width of line/space=100/100–200/200 μm/μm), and all of the circuit boards showed high resolution.

EXAMPLE 5

The procedures of Example 4 were repeated except that a coating composition bath obtained from the aqueous dispersion of Preparation Example 2 was used and a 3% aqueous sodium metasilicate solution at 35° C. was used as the developing solution for preparing 300 circuit boards. The patterns were all at excellent conditions.

EXAMPLE 6

A base plate covered with the positive photo-sensitive resist film prepared in the same manner as in Example 1 was dipped into a 1% aqueous sodium carbonate solution at 25° C. for 45 seconds, followed by washing with water, drying, and irradiating the actinic ray from the same exposure device as in Example 1 in a dose of 300 mj/cm$^2$, through a photomask cutting off the actinic ray in the conductive circuit forming area onto the resist film. Thereafter, a 1% aqueous sodium carbonate solution at 30° C. was softly sprayed for 2 minutes under a pressure of 0.2-5 kg/cm$^2$ onto the resist film, followed by washing with water to carry out development, etching away the deposited copper-clad area with an aqueous ferric chloride solution, and stripping the residual unexposed resist film with a 3% aqueous caustic soda solution to obtain a circuit board. In spite of a variation of ±5° C. in the developing solution temperature to a predetermined temperature in the developing step, the fine patterns of line/space 125/125 μm/μm) showed no defects and showed high resolution for all of 300 circuit boards prepared according to the above steps.

COMPARATIVE EXAMPLE 2

The procedures of Example 4 were repeated except for excluding the step of dipping the exposed base plate into the 1% aqueous sodium metasilicate solution at 25° C. for 20 seconds to obtain 300 circuit boards. Because of a variation of ±5° C. in the developing solution temperature to a predetermined temperature in the developing step, many of the above circuit boards caused such defects that the patterns of line/space partly had cuts and pattern zigzags.

EXAMPLE 7

The actinic ray from the same exposure device in Example 1 was irradiated in a dose of 300 mj/cm$^2$ through a photomask, through which a dose of about 60 mj/cm$^2$ of the actinic ray transmits in the conductive circuit-forming area and which does not cut off the actinic ray in the remaining area, onto the base plate covered with the resist film prepared in the same manner as in Example 1.

A 2% aqueous metasilicate solution at 30° C. was softly sprayed for 2 minutes under a pressure of 0.2-5 kg/cm$^2$, followed by washing with water to carry out development. Next, the etching treatment was carried out with an aqueous cupric chloride solution, followed by stripping the residual resist film on the conductive circuit-forming area to obtain a circuit board. All of 300 circuit boards prepared according to the above steps had fine patterns in a pattern width of line/space 100/100–200/200 (μm/μm), and showed high resolution.

EXAMPLE 8

The procedures of Example 7 were repeated except that a coating composition bath obtained from the aqueous dispersion of Preparation Example 2 was used and a 3% aqueous metasilicate solution was used as the developing solution to obtain 300 circuit boards. The patterns were all at excellent conditions.

COMPARATIVE EXAMPLE 3

The procedures of Example 7 were repeated except that the conventional photomask which cut off the actinic ray by 100% in the conductive circuit-forming area was used in place of the photomask used in Example 7, to obtain 300 circuit boards. Because of a variation of ±5° C. in the developing solution temperature to a predetermined temperature in the developing step, many of the above circuit boards showed that the patterns of line/space partly had cuts and pattern zigzags.

What is claimed is:

1. In a process for preparing a printed-circuit board, which comprising, successively: (I) forming a positive photo-sensitive resist film by electrodeposition coating process onto a circuit board having a conductive film; (II) irradiating an actinic ray in a full exposed dose necessary for making the exposed resist film to be photo-decomposed and developable onto the positive photo-sensitive resist film through a photomask for masking off the conductive area to prevent irradiation of said conductive areas; (III) developing the resultant resist film to form a patterned resist film; (IV) etching away a deposited copper-clad area using the patterned resist film as an etching mask; and (V) removing the remaining resist film on the conductive circuit-forming area; the improvement further comprising dipping the resist film into a weak alkaline solution at 20° to 35° C. for 2 to 60 seconds followed by drying to impart an increased alkali resistance to the resist film in the conductive circuit-forming area after irradiating the actinic ray through the photomask and prior to developing the resulting resist film.

2. In a process for preparing a printed-circuit board, which comprising, successively: (I) forming a positive photo-sensitive resist film by electrodeposition coating process onto a circuit board having a conductive film; (II) irradiating an actinic ray in a full exposed dose necessary for making the exposed resist film to be photo-decomposed and developable onto the positive photo-sensitive resist film through a photomask for masking off the conductive areas to prevent irradiation of said conductive areas; (III) developing the resultant resist film to form a patterned resist film; (IV) etching away a deposited copper-clad area using the patterned resist film as an etching mask; and (V) removing the remaining resist film on the conductive circuit-forming area; the improvement further comprising dipping the resist film into a weak alkaline solution at 20° to 35° C. for 2 to 60 seconds followed by drying to impart an increased alkali resistance to the resist film in the conductive circuit-forming area prior to irradiating the actinic ray through the photomask.

3. A process as claimed in claim 1 or 2, wherein the aqueous weak alkaline solution is selected from 0.1 to 3 percent aqueous solutions of sodium carbonate, sodium metasilicate or amine.

4. A process as claimed in claim 1 or 2, wherein a positive electrodeposition coating composition is used for forming the positive photo-sensitive resist film comprising an acrylic resin having in the molecule an ion-forming group to be ionized by neutralization and a photo-sensitive group represented by the following formula (I):

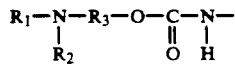
(I)

wherein $R_1$ represents:

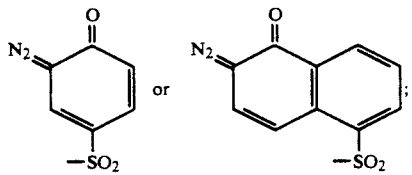

$R_2$ represents a hydrogen atom, an alkyl group, a cycloalkyl group or an alkoxyalkyl group, and $R_3$ represents an alkylene group, a cycloalkylene group or an alkoxyalkylene group.

5. In a process for preparing a printed-circuit board, which comprises, successively: (I) forming a positive photo-sensitive resist film by electrodeposition coating process onto a circuit board having a conductive film; (II) irradiating an actinic ray in a full exposed dose necessary for making the exposed resist film to be photo-decomposed and developable onto the positive photo-sensitive resist film through a photomask for masking off the conductive areas to prevent irradiation of said conductive areas; (III) developing the resultant resist film to form a patterned resist film; (IV) etching away deposited copper-clad area using the patterned resist film as an etching mask; and (V) removing the remaining resist film on the conductive circuit-forming area; the improvement further comprising irradiating the actinic ray in a full exposed dose necessary for making the exposed resist film to be photo-decomposed and developable onto the resist film not through said photomask but through such a photomask that the actinic ray transmits in a dose equal to 5 to 40 percent of the full exposed dose in the conductive circuit-forming area to impart an increased alkali resistance to the resist film thereon, but fully transmits in the area not forming the conductive circuit instead of step (II).

6. A process as claimed in claim 5, wherein a positive electrodeposition coating composition is used for forming the positive photo-sensitive resist film comprising an acrylic resin having in the molecule an ion-forming group to be ionized by neutralization and a photo-sensitive group represented by the following formula (I):

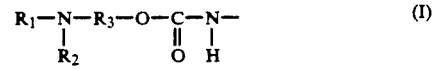
(I)

wherein $R_1$ represents:

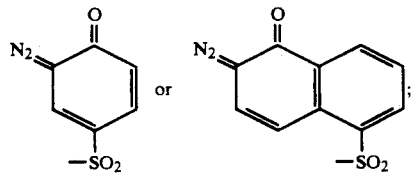

$R_2$ represents a hydrogen atom, an alkyl group, a cycloalkyl group or an alkoxyalkyl group, and $R_3$ represents an alkylene group, a cycloalkylene group or an alkoxyalkylene group, and wherein the full dose of the actinic ray is in the range of 180 to 400 mj/cm².

* * * * *